US008717050B2

(12) United States Patent
Liao et al.

(10) Patent No.: US 8,717,050 B2
(45) Date of Patent: May 6, 2014

(54) METHOD FOR PANEL RELIABILITY TESTING AND DEVICE THEREOF

(75) Inventors: Shiue-Shih Liao, Shenzhen (CN); Jung-Mao Tsai, Shenzhen (CN); Xiao-Xin Zhang, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 311 days.

(21) Appl. No.: 13/376,941

(22) PCT Filed: Jun. 19, 2011

(86) PCT No.: PCT/CN2011/075908

§ 371 (c)(1), (2), (4) Date: Dec. 8, 2011

(87) PCT Pub. No.: WO2012/162915

PCT Pub. Date: Dec. 6, 2012

(65) Prior Publication Data

US 2012/0306520 A1 Dec. 6, 2012

(51) Int. Cl.

*G01R 31/00* (2006.01)
*G01R 31/26* (2006.01)

(52) U.S. Cl.

USPC ............. 324/750.16; 324/760.01; 324/761.01

(58) Field of Classification Search

None
See application file for complete search history.

(56) References Cited

U.S. PATENT DOCUMENTS

2002/0054007 A1 5/2002 Asao et al.
2005/0159069 A1 7/2005 Yamauchi et al.
2005/0215159 A1 * 9/2005 Yamauchi et al. ................ 445/6
2006/0228972 A1 10/2006 Akiyama et al.
2006/0273345 A1 12/2006 Lee et al.
2007/0080924 A1 * 4/2007 Shin .............................. 345/102
2008/0088550 A1 4/2008 Kim et al.

FOREIGN PATENT DOCUMENTS

| | | | |
|---|---|---|---|
| CN | 1566980 | A | 1/2005 |
| CN | 1800869 | A | 7/2006 |
| CN | 1873489 | A | 12/2006 |
| CN | 101034646 | A | 9/2007 |
| CN | 101183831 | A | 5/2008 |
| CN | 201111843 | Y | 9/2008 |
| CN | 101290405 | A | 10/2008 |
| CN | 201194159 | Y | 2/2009 |
| KR | 10-2005-0015029 | A | 2/2005 |
| WO | 2005008709 | A1 | 1/2005 |

* cited by examiner

*Primary Examiner* — Minh N Tang

(74) *Attorney, Agent, or Firm* — Mark M. Friedman

(57) ABSTRACT

A device for panel reliability testing and method thereof are proposed. The device includes a connection module, for connecting the panel and an aging module; a reliability chamber control module for sending a voltage regulation command to a bias module and/or a switch control command to the aging module; the bias module, for regulating voltage and transmitting information about voltage regulation to the aging module; and the aging module, for performing an aging operation on the panel depending on the switch control command sent from the reliability chamber control module and the information about voltage regulation transmitted from the bias module. Compared with the prior art, LCD panels undergo the aging testing before being packaged, thereby shortening a time period of manufacturing LCD panels and enhancing production efficiency.

13 Claims, 6 Drawing Sheets

METHOD FOR PANEL RELIABILITY TESTING AND DEVICE THEREOF

BACKGROUND OF THE INVENTION

1. Field of the Invention

The present invention relates to a device for testing a liquid crystal display (LCD) panel, and more particularly, to a device for panel reliability testing.

The present invention further relates to a method for testing a liquid crystal display panel, and more particularly, to a method for panel reliability testing.

2. Description of the Prior Art

Generally speaking, each liquid crystal display panel needs to undergo reliability testing. Reliability is defined as the probability that a functional unit will perform its required property or function under stated environments/conditions for a specific period of time. For the reliability testing, aging testing is one of the important testing items.

At present, the reliability testing is performed on an assembled LCD panel, which not only wastes time but also needs to prepare for many components, such as a driver circuit and a backlight module, for the LCD panel undergoing the reliability testing. Accordingly, manufacturing cost is increased.

A commonly used method for the LCD panel reliability testing includes using probes to contact liquid crystal cell, to input signals to the liquid crystal cell, and examining the liquid crystal cell through backlight. However, a prior device for the LCD panel reliability is seldom put into a chamber of a testing equipment because such the prior device is bulky and expensive.

Therefore, there is a need for providing a method for panel reliability testing and a device thereof to solve the problem occurring in the prior art.

SUMMARY OF THE INVENTION

An object of the present invention is to provide a method for panel reliability testing and a device thereof so as to solve high testing cost and low testing efficiency when testing LCD panels.

According to the present invention, a device for panel reliability testing comprises: a connection module, for connecting the panel and an aging module; a reliability chamber control module, for sending a voltage regulation command to a bias module and/or a switch control command to the aging module; the bias module, for regulating voltage and transmitting information about voltage regulation to the aging module; and the aging module, for performing an aging operation on the panel depending on the switch control command sent from the reliability chamber control module and the information about voltage regulation transmitted from the bias module. The connection module further comprises: a probe, for being connected to a test pad in the panel; an adjustment module, for adjusting the position of the probe and the position of the test pad; a transfer module, for transferring aging signals sent from the aging module to the probe; a multiplexing module, for collecting information about a switch-on/off state of the probe and sending the information to a feedback module through simultaneous multiplexing; and the feedback module, for determining if the probe is connected to the test pad, wherein the feedback module is electrically connected to the adjustment module, and the feedback module calculates an adjustment amount and an adjustment direction to adjust the position of the probe relative to the test pad and commands the adjustment module to adjust the probe and the test pad when the feedback module itself determines that the probe fails to be connected to the test pad.

In one aspect of the present invention, the adjustment module comprises a first adjustment module and a second adjustment module, both are disposed on an alignment of the probe.

In another aspect of the present invention, the first adjustment module and the second adjustment module are disposed at both ends of the probe.

According to present invention, a device for panel reliability testing comprises: a connection module, for connecting the panel and an aging module; a reliability chamber control module, for sending a voltage regulation command to a bias module and/or a switch control command to the aging module; the bias module, for regulating voltage and transmitting information about voltage regulation to the aging module; and the aging module, for performing an aging operation on the panel depending on the switch control command sent from the reliability chamber control module and the information about voltage regulation transmitted from the bias module.

In one aspect of the present invention, the connection module further comprises: a probe, for being connected to a test pad in the panel; an adjustment module, for adjusting the position of the probe and the position of the test pad; a transfer module, for transferring aging signals sent from the aging module to the probe; a multiplexing module, for collecting information about a switch-on/off state of the probe and sending the information to a feedback module through simultaneous multiplexing; and the feedback module, for determining if the probe is connected to the test pad.

In another aspect of the present invention, the feedback module is electrically connected to the adjustment module, and the feedback module calculates an adjustment amount and an adjustment direction to adjust the position of the probe relative to the test pad and commands the adjustment module to adjust the probe and the test pad when the feedback module itself determines that the probe fails to be connected to the test pad.

In yet another aspect of the present invention, the connection module further comprises: an alarm module, for generating alarm signals once the adjustment module cannot adjust the probe and the test pad.

In still another aspect of the present invention, the reliability chamber control module comprises: a storage module, for storing programs for panel reliability testing; a clock signal generation module, for generating clock signals; and a dominating module, for reading the programs from the storage module, generating a control command, and for sending the control command to the aging module and/or the bias module according to the clock signals.

According to present invention, a method for panel reliability testing comprises a reliability chamber control module, a bias module, an aging module, and a connection module. The method comprises the following steps of: (A) the connection module connecting the panel to the aging module; (B) the reliability chamber control module sending a voltage regulation command to the bias module and/or a switch control command to the aging module; (C) the bias module regulating voltage and transmitting information about voltage regulation to the aging module; and (D) the aging module performing an aging operation on the panel according to the switch control command sent from the reliability chamber control module and the information about voltage regulation transmitted from the bias module.

In one aspect of the present invention, the connection module comprises a probe, a transfer module, a feedback module, an adjustment module, and a multiplexing module, and the (A) step further comprises the following steps of: (a1) connecting the probe to a test pad in the panel; (a2) the adjustment module adjusting the position of the probe and the position of the test pad; (a3) the transfer module transferring aging signals sent from the aging module to the probe; (a4) the multiplexing module collecting information about a switch-on/off state of the probe and sending the information to the feedback module through simultaneous multiplexing; and (a5) the feedback module determining if the probe is connected to the test pad.

In another aspect of the present invention, the feedback module is electrically connected to the adjustment module, and the method further comprises the following step of: (a6) the feedback module calculating an adjustment amount and an adjustment direction to adjust the position of the probe relative to the test pad and commanding the adjustment module to adjust the probe and the test pad when the feedback module itself determines that the probe fails to be connected to the test pad.

In yet another aspect of the present invention, the connection module further comprises an alarm module, and the method further comprises the following step of: (a7) generating an alarm signal once the adjustment module is incapable of adjusting the probe and the test pad.

In still another aspect of the present invention, the reliability chamber control module comprises a storage module, a clock signal generation module, and a dominating module, and the (B) step further comprises the following steps of: (b1) the storage module storing programs for panel reliability testing; (b2) the clock signal generation module generating clock signals; and (b3) the dominating module reading the programs from the storage module, generating a control command, and sending the control command to the aging module and/or the bias module according to the clock signals.

In contrast to the conventional technology, LCD panels undergo the aging testing before being packaged in the present invention, thereby shortening a time period of manufacturing LCD panels and enhancing production efficiency.

These and other features, aspects and advantages of the present disclosure will become understood with reference to the following description, appended claims and accompanying figures.

DETAILED DESCRIPTION OF THE PREFERRED EMBODIMENTS

Figure 1:
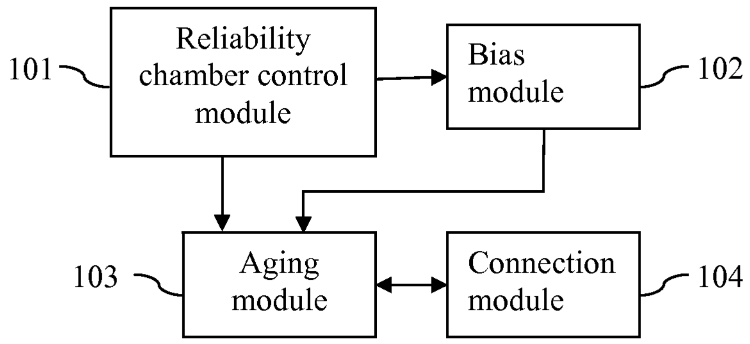
FIG. 1 is a block diagram of a device for panel reliability testing according to a preferred embodiment of the present invention.

Spatially relative terms, such as “beneath”, “below”, “lower”, “above”, “upper” and the like, may be used herein for ease of description to describe one element or feature’s relationship to another element(s) or feature(s) as illustrated in the figures. It will be understood that the spatially relative terms are intended to encompass different orientations of the device in use or operation in addition to the orientation depicted in the figures.

In the following description, units with a similar structure will be labeled by the same reference numerals though they are shown in different drawings.

Figure 2:
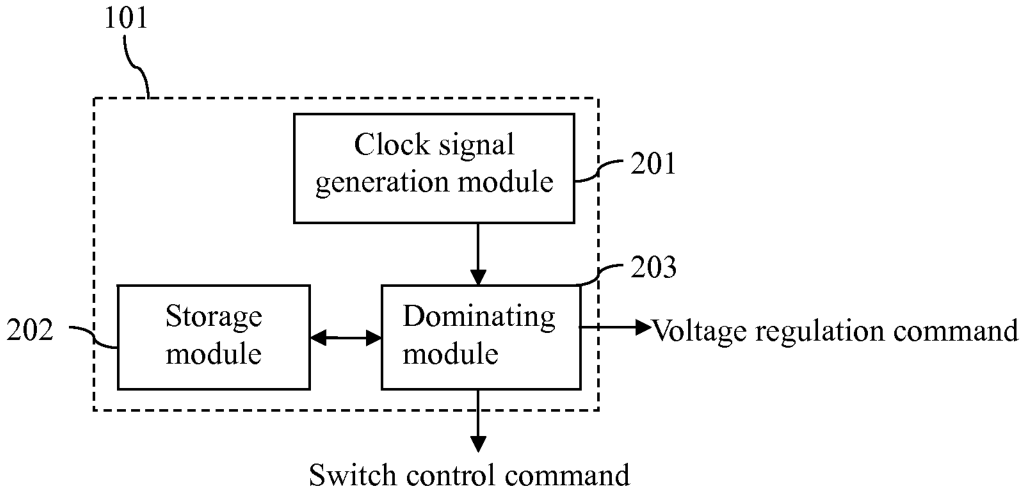
FIG. 2 is a block diagram of the reliability chamber control module shown in FIG. 1.

Referring to FIG. 1, a device for panel reliability testing comprises a reliability chamber control module 101, a bias module 102, an aging module 103, and a connection module 104. As shown in FIG. 2, the reliability chamber control module 101 comprises a dominating module 203, a storage module 202, and a clock signal generation module 201. The storage module 202 stores programs for panel reliability testing. The clock signal generation module 201 generates clock signals. The dominating module 203 reads corresponding programs from the storage module 202 and generates corresponding control commands according to the clock signals generated by the clock signal generation module 201. The reliability chamber control module 101 is electrically connected to the aging module 103. The reliability chamber control module 101 sends switch control signals to the aging module 103. According to the switch control signals, the aging module 103 drives an liquid crystal (LC) cell when a predetermined time is up and then turns on an LCD panel in a way of an automatically switched pattern mode or a fixed pattern mode. The reliability chamber control module 101 is electrically connected to the bias module 102 and sends a voltage regulation command to the bias module 102.

Figure 5:
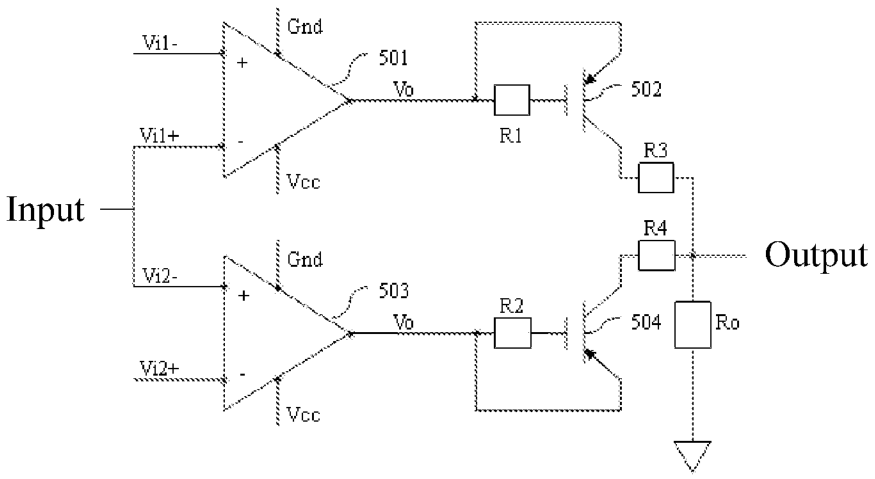
FIG. 5 depicts a circuit diagram of the bias module of the device for panel reliability testing according to a preferred embodiment of the present invention.

The bias module 102 receives the voltage regulation command and regulates voltage automatically according to the voltage regulation command. Referring to FIG. 5, $V_{i1-}$ and $V_{i2+}$ indicates reference voltage, $R_1$ indicates a first resistor, $R_2$ indicates a second resistor, $R_3$ indicates a third resistor, $R_4$ indicates a fourth resistor, and $R_0$ indicates a fifth resistor. The first resistor $R_1$, a first bipolar junction transistor (BJT) 502, the third resistor $R_3$ are electrically connected to a first operational amplifier 501. Specifically, the first resistor $R_1$, the first BJT 502, and the third resistor $R_3$ are sequentially connected in series. The output of the first operational amplifier 501 is electrically connected to the first resistor $R_1$. The first resistor $R_1$ is electrically connected to a base of the first BJT 502. An emitter of the first BJT 502 is electrically connected to the output of the first operational amplifier 501. A collector of the first BJT 502 is electrically connected to the third resistor $R_3$. The third resistor $R_3$ is connected to the output of the bias module 102. The second resistor $R_2$, a second BJT 504, and the fourth resistor $R_4$ are electrically connected to a second operational amplifier 503. Specifically, the second resistor $R_2$, the second BJT 504, and the fourth resistor $R_4$ are sequentially connected in series. The output of the second operational amplifier 503 is electrically connected to the second resistor $R_2$. The second resistor $R_2$ is electrically connected to a base of the second BJT 504. An emitter of the second BJT 504 is electrically connected to the output of the second operational amplifier 503. A collector of the second BJT 504 is electrically connected to the fourth resistor $R_4$. The fourth resistor $R_4$ is connected to the output of the bias module 102. $V_{cc}$ is supply voltage. Gnd (Voltage applied on the ground) is zero. The bias module 102 regulates voltage according to the following program:

If, $V_{cc}$=15v, $R_3$=0.17$R_0$, $R_4$=0.27$R_0$ $R_1$=$R_2$=0.1$R_0$, $V_{i1-}$=3.6v; $V_{i2+}$=3.3v;
Then,
INPUT>3.6v, OUTPUT=12.8v;
INPUT<3.3v, OUTPUT=11.8v.

Figure 3:
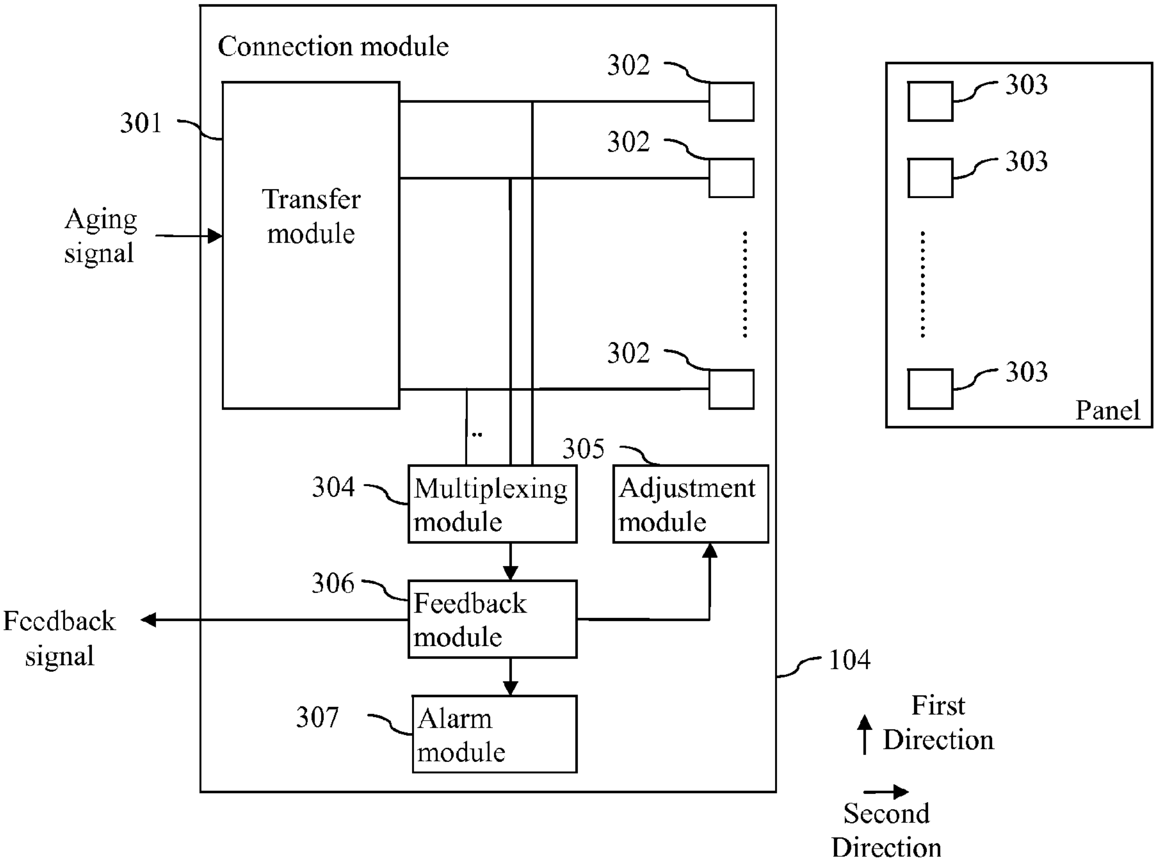
FIG. 3 illustrates a connection between the connection module connecting to a panel according to a first embodiment of the present invention.

OUTPUT=15V×$R_0$/($R_3$+$R_0$)=12.8V stands when the input voltage is larger than 3.6 volts (i.e., INPUT>$V_{i1-}$ and INPUT>$V_{i2+}$), the voltage $V_0$ output by the first operational amplifier 501 is $V_0$=$V_{cc}$=15V, the first BJT 502 conducts, the voltage $V_0$ output by the second operational amplifier 503 is $V_0$=Gnd=0V, and the second BJT 504 does not conduct. OUTPUT=15V×$R_0$/($R_4$+$R_0$)=11.8V stands when the input voltage is smaller than 3.3 volts (i.e., INPUT>$V_{i1-}$ and INPUT>$V_{i2+}$), the voltage $V_0$ output by the first operational amplifier 501 is $V_0$=Gnd=0V, the first BJT 502 does not conduct, the voltage $V_0$ output by the second operational amplifier 503 is $V_0$=$V_{cc}$=15V, and the second BJT 504 conducts. The bias module 102 electrically connected to the aging module 103 transmits information about voltage regulation to the aging module 103 electrically connected to the connection module 104. The connection module 104 comprises a plurality of probes 302. As shown in FIG. 3, each of the plurality of probes 302 in the connection module 104 is connected to a test pad 303 in the LC cell. The aging module 103 performs an aging operation on the panel according to the switch control signals sent from the reliability chamber control module 101 and the information about voltage regulation sent from the bias module 102. The reliability chamber control module 101 is capable of controlling either the aging module 103 or the bias module 102 independently. In addition, the reliability chamber control module 101 is able to control the aging module 103 and the bias module 102 at the same time.

Poor contact between the connection module 104 and the test pads 303 in the LC cell probably occurs during the process of panel reliability testing, so operators have to reconnect the connection module 104 to the test pad 303. It not only wastes a lot of time but also hinders an increase in production capacity. A solution to the above-mentioned problem is that a multiplexing module 304, a feedback module 306, an adjustment module 305, an alarm module 307, and a transfer module 301 are disposed in the connection module 104, as shown in FIG. 3. The transfer module 301 transfers aging signals from the aging module 103 to each probe 302. The multiplexing module 304 is electrically connected to each probe 302 for collecting detecting signals from each of the plurality of probes 302, and multiplexes all of the detecting signals as a mixed signal to be sent to the feedback module 306. The feedback module 306 demultiplexes the received mixed signal, analyzes the result of the demultiplexing, and determines if each of the plurality of probes 302 is connected to the test pad 303 successfully. If so, the feedback module 306 sends feedback signals to the aging module 103 to notify the aging module 103 that each of the plurality of probes 302 in the connection module 104 is successfully connected to the test pad 303 in the LC cell, so that the aging module 103 can perform an aging operation. If not, the feedback module 306 sends a control command to the adjustment module 305. After receiving the control command, the adjustment module 305 readjusts the position of each of the plurality of probes 302 and the position of the test pad 303 and does not cease until the plurality of probes 302 are connected to the test pad 303 successfully. The feedback module 306 sends a control command to the alarm module 307 once the plurality of probes 302 in the connection module 104 are not connected to the test pad 303 successfully within a predetermined duration. Then, the alarm module 307 sends alarm signals to notify the operators that the plurality of probes 302 in the connection module 104 are not successfully connected to the test pad 303 in the LC cell. The multiplexing module 304 collects detecting signals from each of the plurality of probes 302 connected to the test pad 303. Then, the detecting signals instruct the operators how to successfully prepare for the reliability testing once through the feedback module 306 and the alarm module 307, so that the operators do not have to restart to perform the aging testing due to poor connection of the plurality of probes 302 to the test pad 303.

Definitely, the multiplexing module 304 which multiplexes each detecting signal in the connection module 104 in the device for panel reliability testing can be replaced by a current-collecting module according to the present invention. The current-collecting module collects the detecting signals from each of the plurality of probes 302 and sends all of the detecting signals to the feedback module 306 one by one. The feedback module 306 determines a switch-on/off state of each of the plurality of probes 302 one by one. In the device for panel reliability testing, the feedback module 306 calculates an adjustment amount and an adjustment direction of the position of the connection module 104 relative to the panel through the detecting signals sent from the multiplexing module 304 or from the current-collecting module when the feedback module 306 itself determines that the plurality of probes 302 in the connection module 104 fail to be connected to the test pad 303 in the panel. Next, the feedback module 306 transmits information about the adjustment amount and the adjustment direction to the adjustment module 305, which adjusts the position of the connection module 104 and the position of the panel according to the information.

Figure 4:
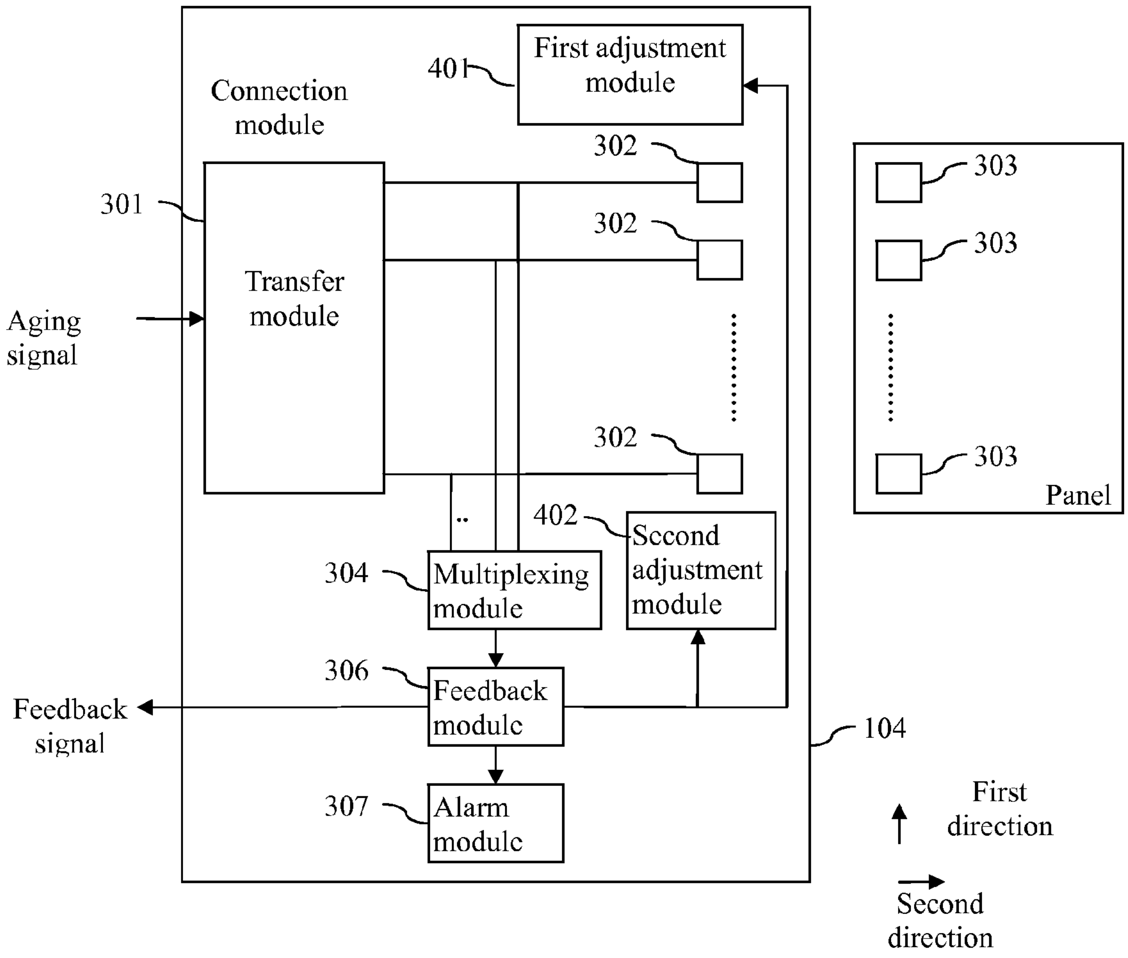
FIG. 4 illustrates a connection between the connection module connecting to a panel according to a second embodiment of the present invention.

Preferably, more than one adjustment module 305 is placed along the alignment of the plurality of probes 302 in the connection module 104. For example, a first adjustment module 401 and a second adjustment module 402 are disposed at both ends of the plurality of probes 302, respectively, as shown in FIG. 4. At first, connect the plurality of probes 302 in the connection module 104 to the test pad 303 in the panel manually so as to ensure that the plurality of probes 302 and the test pad 303 are not deviated along a second direction. Next, set a minimum adjustment unit for the adjustment module 305, the width of the plurality of probes 302 along a first direction, and the distance between the two probes 302 in the feedback module 306. Once the feedback module 306 determines that none of the plurality of probes 302 is successfully connected to the test pad 303 according to the detecting signals received by the feedback module 306 itself, a deviation does exist between the plurality of probes 302 and the test pad 303 towards or against the first direction. Next, the feedback module 306 commands the adjustment module 305 to adjust the connection module 104 towards (or against) the first direction based on the minimum adjustment unit. The adjustment amount (i.e., regulation amount) is less than the distance between the two probes 302. At this time, the multiplexing module 304 or the current-collecting module collects the detecting signals from the plurality of probes 302. If the feedback module 306 determines that one probe 302 near the first adjustment module 401 is not successfully connected in the column of the probes 302, the feedback module 306 commands the adjustment module 305 to perform adjustment against the first direction based on the minimum adjustment unit or the space between the two probes 302. If the feedback module 306 determines that a plurality of probes 302 at one end of the probes 302 (for example, near the first adjustment module 401) are not successfully connected with the test pad 303, the feedback module 306 commands the second adjustment module 402 unmoved. Then, the first adjustment module 401 performs adjustment towards or against the second direction based on the minimum adjustment unit.

Figure 6:
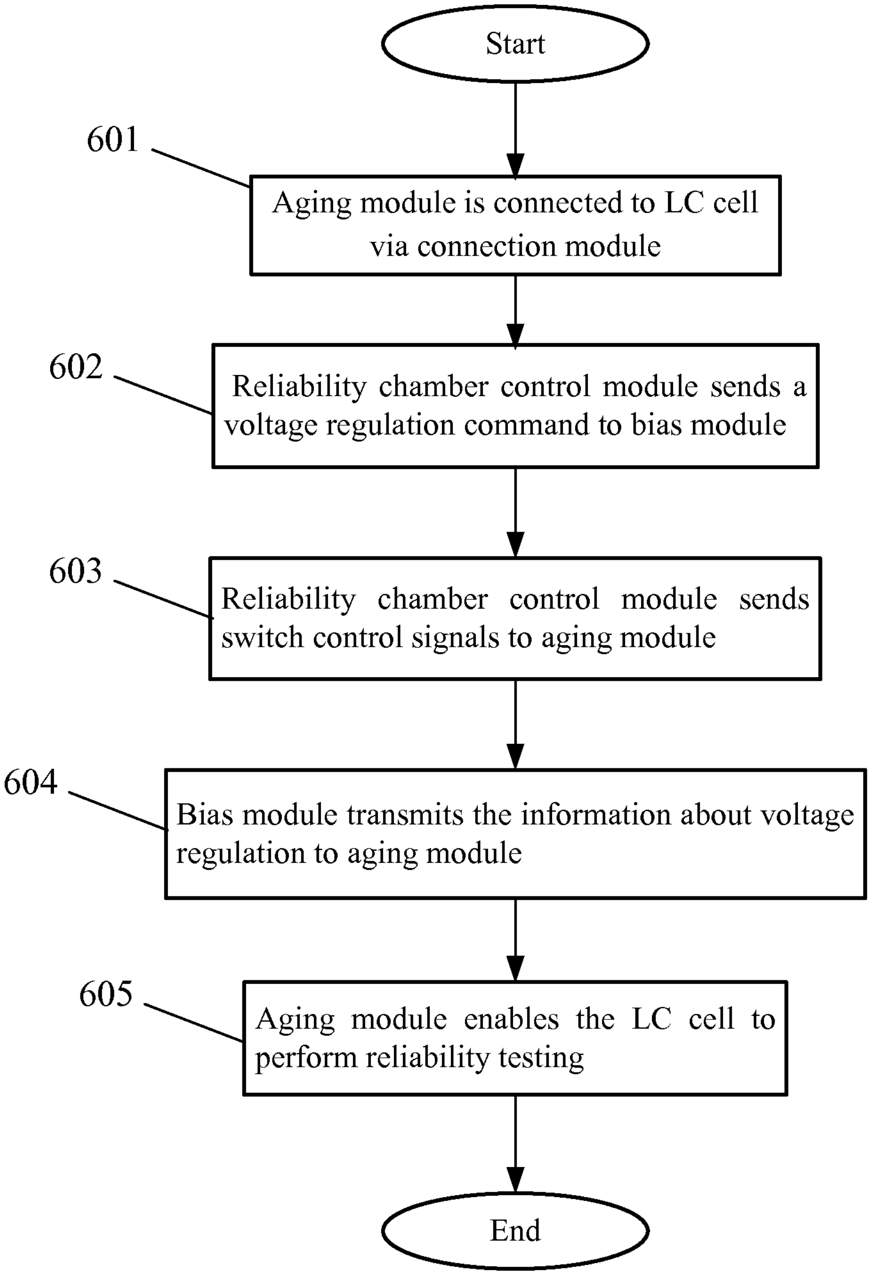
FIG. 6 is a flowchart of a method of testing panel reliability according to a preferred embodiment of the present invention.

Referring to FIG. 6, FIG. 6 is a flow chart showing a method for panel reliability testing according to the embodiment of the present invention. In step 601, the aging module 103 is connected to the LC cell via the connection module 104. Specifically, the connection module 104 is electrically connected to the aging module 103, and is physically and electrically connected to the LC cell. The connection module 104 transfers the aging signals sent from the aging module 103 to the LC cell. In Step 602, the reliability chamber control module 101 sends a voltage regulation command to the bias module 102. In step 603, the reliability chamber control module 101 sends switch control signals to the aging module 103 to enable the aging module 103. In Step 604, the bias module 102 transmits the information about voltage regulation to the aging module 103. In step 605, the aging module 103 enables the LC cell to perform the reliability testing.

Figure 7:
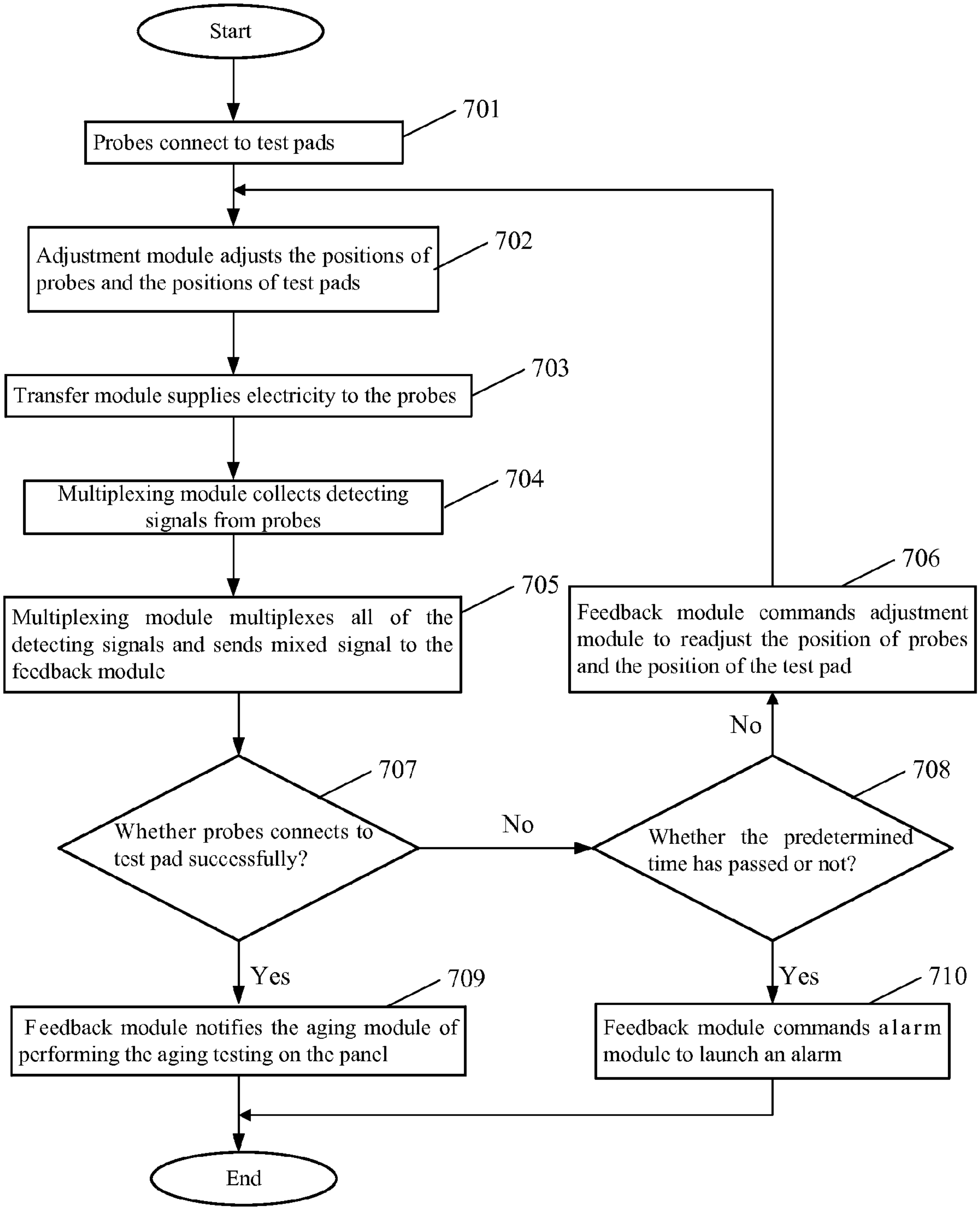
FIG. 7 is a flowchart of a step of connecting the aging module to the LC cell via the connection module as illustrated in FIG. 6.

Referring to FIG. 7, FIG. 7 is a flow chart showing the connection module 104 connected to the aging module 103 and to the LC cell. In Step 701, the plurality of probes 302 in the connection module 104 are connected to the test pad 303 in the panel. In Step 702, the adjustment module 305 adjusts the position of each of the plurality of probes 302 and the position of the test pad 303. In Step 703, the transfer module 301 supplies electricity to the plurality of probes 302. In Step 704, the multiplexing module 304 collects the detecting signals from each of the plurality of probes 302. In step 705, the multiplexing module 304 multiplexes all of the detecting signals so that the detecting signals become a mixed signal and sends the mixed signal to the feedback module 306 through simultaneous multiplexing. In Step 705, the multiplexing module 304 can be replaced by a current-collecting module. The current-collecting module collects the detecting signals from each of the plurality of probes 302 and sends all of the detecting signals to the feedback module 306 one by one. In Step 707, the feedback module 306 demultiplexes the detecting signals sent from the multiplexing module 304, analyzes the result of the demultiplexing, and determines if each of the plurality of probes 302 is connected to the test pad 303 successfully. Or, the feedback module 306 analyzes the electrifying state of each of the plurality of probes 302 one by one to determine if each of the plurality of probes 302 is connected to the test pad 303 successfully. If so, go to Step 709 in which the feedback module 306 notifies the aging module 103 of performing the aging testing on the panel. If not, go to Step 708 in which the feedback module 306 determines whether the predetermined time has passed or not. Once the predetermined time has passed, go to Step 710 in which the feedback module 306 commands the alarm module 307 to launch an alarm. If the predetermined time has not arrived, go to Step 706 in which the feedback module 306 commands the adjustment module 305 to readjust position of each of the plurality of probes 302 and position of the test pad 303. The adjustment module 305 keeps performing adjustment again and again until the plurality of probes 302 are connected to the test pad 303 successfully.

The method for panel reliability testing further comprises the following steps: the feedback module 306 calculates an adjustment amount and an adjustment direction of position of the connection module 104 relative to the panel according to the detecting signals sent from the multiplexing module 304 or from the current-collecting module when the feedback module 306 itself determines that the plurality of probes 302 in the connection module 104 fail to be connected to the test pad 303 in the panel. Subsequently, information about the adjustment amount and the adjustment direction is transmitted to the adjustment module 305, which adjusts the position of the connection module 104 and the position of the panel according to the information.

Some operations are complicated during the operators perform the reliability testing on panels. So in a preferred embodiment, the aging module 103 is integrated with the connection module 104. The aging module 103 is integrated and functions as a semaphore in the device for panel reliability testing in the present invention. In this way, the operations can be simplified.

In sum, the present invention has been disclosed in connection with the preferred embodiments shown and described in detail while the foregoing embodiments are not intended to limit the scope of the invention. Various modifications and improvements thereon will become readily apparent to those ordinarily skilled in the art. The protection scope of a patent right is determined by the patent claim.

What is claimed is:

1. A device for panel reliability testing, wherein the device comprises:

a connection module, for connecting the panel and an aging module;

a reliability chamber control module, for sending a voltage regulation command to a bias module and/or a switch control command to the aging module;

the bias module, for regulating voltage and transmitting information about voltage regulation to the aging module; and the aging module, for performing an aging operation on the panel depending on the switch control command sent from the reliability chamber control module and the information about voltage regulation transmitted from the bias module;

wherein the connection module further comprises:

a probe, for being connected to a test pad in the panel;

an adjustment module, for adjusting the position of the probe and the position of the test pad;

a transfer module, for transferring aging signals sent from the aging module to the probe;

a multiplexing module, for collecting information about a switch-on/off state of the probe and sending the information to a feedback module through simultaneous multiplexing; and the feedback module, for determining if the probe is connected to the test pad, wherein the feedback module is electrically connected to the adjustment module, and the feedback module calculates an adjustment amount and an adjustment direction to adjust the position of the probe relative to the test pad and commands the adjustment module to adjust the probe and the test pad when the feedback module itself determines that the probe fails to be connected to the test pad.

2. The device for panel reliability testing of claim 1, wherein the adjustment module comprises a first adjustment module and a second adjustment module, both are disposed on an alignment of the probe.

3. The device for panel reliability testing of claim 2, wherein the first adjustment module and the second adjustment module are disposed at both ends of the probe.

4. A device for panel reliability testing, wherein the device comprises:

a connection module, for connecting the panel and an aging module;

a reliability chamber control module, for sending a voltage regulation command to a bias module and/or a switch control command to the aging module;

the bias module, for regulating voltage and transmitting information about voltage regulation to the aging module; and the aging module, for performing an aging operation on the panel depending on the switch control command sent from the reliability chamber control module and the information about voltage regulation transmitted from the bias module.

5. The device for panel reliability testing claim 4, wherein the connection module further comprises:

a probe, for being connected to a test pad in the panel;

an adjustment module, for adjusting the position of the probe and the position of the test pad;

a transfer module, for transferring aging signals sent from the aging module to the probe;

a multiplexing module, for collecting information about a switch-on/off state of the probe and sending the information to a feedback module through simultaneous multiplexing; and the feedback module, for determining if the probe is connected to the test pad.

6. The device for panel reliability testing of claim 5, wherein the feedback module is electrically connected to the adjustment module, and the feedback module calculates an adjustment amount and an adjustment direction to adjust the position of the probe relative to the test pad and commands the adjustment module to adjust the probe and the test pad when the feedback module itself determines that the probe fails to be connected to the test pad.

7. The device for panel reliability testing of claim 6, wherein the connection module further comprises:

an alarm module, for generating alarm signals once the adjustment module cannot adjust the probe and the test pad.

8. The device for panel reliability testing of claim 4, wherein the reliability chamber control module comprises:

a storage module, for storing programs for panel reliability testing;

a clock signal generation module, for generating clock signals; and a dominating module, for reading the programs from the storage module, generating a control command, and for sending the control command to the aging module and/or the bias module according to the clock signals.

9. A method for panel reliability testing, wherein the method comprises a reliability chamber control module, a bias module, an aging module, and a connection module, and comprises the following steps of:

(A) the connection module connecting the panel to the aging module;

(B) the reliability chamber control module sending a voltage regulation command to the bias module and/or a switch control command to the aging module;

(C) the bias module regulating voltage and transmitting information about voltage regulation to the aging module; and (D) the aging module performing an aging operation on the panel according to the switch control command sent from the reliability chamber control module and the information about voltage regulation transmitted from the bias module.

10. The method for panel reliability testing of claim 9, wherein the connection module comprises a probe, a transfer module, a feedback module, an adjustment module, and a multiplexing module, and the (A) step further comprises the following steps of:

(a1) connecting the probe to a test pad in the panel;

(a2) the adjustment module adjusting the position of the probe and the position of the test pad;

(a3) the transfer module transferring aging signals sent from the aging module to the probe;

(a4) the multiplexing module collecting information about a switch-on/off state of the probe and sending the information to the feedback module through simultaneous multiplexing; and (a5) the feedback module determining if the probe is connected to the test pad.

11. The method for panel reliability testing of claim 10, wherein the feedback module is electrically connected to the adjustment module, and the method further comprises the following step of:

(a6) the feedback module calculating an adjustment amount and an adjustment direction to adjust the position of the probe relative to the test pad and commanding the adjustment module to adjust the probe and the test pad when the feedback module itself determines that the probe fails to be connected to the test pad.

12. The method for panel reliability testing of claim 11, wherein the connection module further comprises an alarm module, and the method further comprises the following step of:

(a7) generating an alarm signal once the adjustment module is incapable of adjusting the probe and the test pad.

13. The method for panel reliability testing of claim 9, wherein the reliability chamber control module comprises a storage module, a clock signal generation module, and a dominating module, and the (B) step further comprises the following steps of:

(b1) the storage module storing programs for panel reliability testing;

(b2) the clock signal generation module generating clock signals; and (b3) the dominating module reading the programs from the storage module, generating a control command, and sending the control command to the aging module and/or the bias module according to the clock signals.

* * * * *